United States Patent
Walter et al.

(10) Patent No.: US 7,521,677 B2
(45) Date of Patent: Apr. 21, 2009

(54) METHOD AND DEVICE FOR DISTANCE MEASUREMENT

(75) Inventors: Gero Walter, Westhausen (DE); Rainer Härle, Heidenheim (DE)

(73) Assignee: Carl Zeiss NTS GmbH (DE)

( * ) Notice: Subject to any disclaimer, the term of this patent is extended or adjusted under 35 U.S.C. 154(b) by 211 days.

(21) Appl. No.: 11/642,249

(22) Filed: Dec. 20, 2006

(65) Prior Publication Data
US 2007/0164215 A1    Jul. 19, 2007

(30) Foreign Application Priority Data
Dec. 21, 2005   (DE) .................. 10 2005 061 687

(51) Int. Cl.
*H01J 37/26* (2006.01)
(52) U.S. Cl. ..................................... 250/310
(58) Field of Classification Search .................. 250/310
See application file for complete search history.

(56) References Cited

U.S. PATENT DOCUMENTS

| | | | |
|---|---|---|---|
| 3,937,956 A | 2/1976 | Lyon | |
| 4,134,014 A | 1/1979 | Neave et al. | |
| 4,978,856 A | 12/1990 | Akado | |
| 5,216,235 A | 6/1993 | Lin | |
| 5,216,325 A | 6/1993 | Patel et al. | |
| 5,557,105 A * | 9/1996 | Honjo et al. | 250/310 |

FOREIGN PATENT DOCUMENTS

| EP | 1 081 741 A2 | 3/2001 |
|---|---|---|
| JP | 07245075 A | 9/1995 |

* cited by examiner

*Primary Examiner*—Kiet T Nguyen
(74) *Attorney, Agent, or Firm*—Muirhead and Saturnelli, LLC

(57) ABSTRACT

A method and a device for determining the distance from the sample to be examined to at least one reference point which function independently of the type of sample. A signal is modulated to a first potential of a sample and a primary particle beam is directed at the sample, resulting in a secondary particle beam being formed by an interaction, the particles of this beam having the modulated signal. The particles of the secondary particle beam and the signal modulated to the potential of the particles of the secondary particle beam are detected. By comparing the detected modulated signal to a reference signal, the distance is determined from the relationship between the reference signal and the detected modulated signal. The device has the corresponding components for implementing the method.

28 Claims, 1 Drawing Sheet

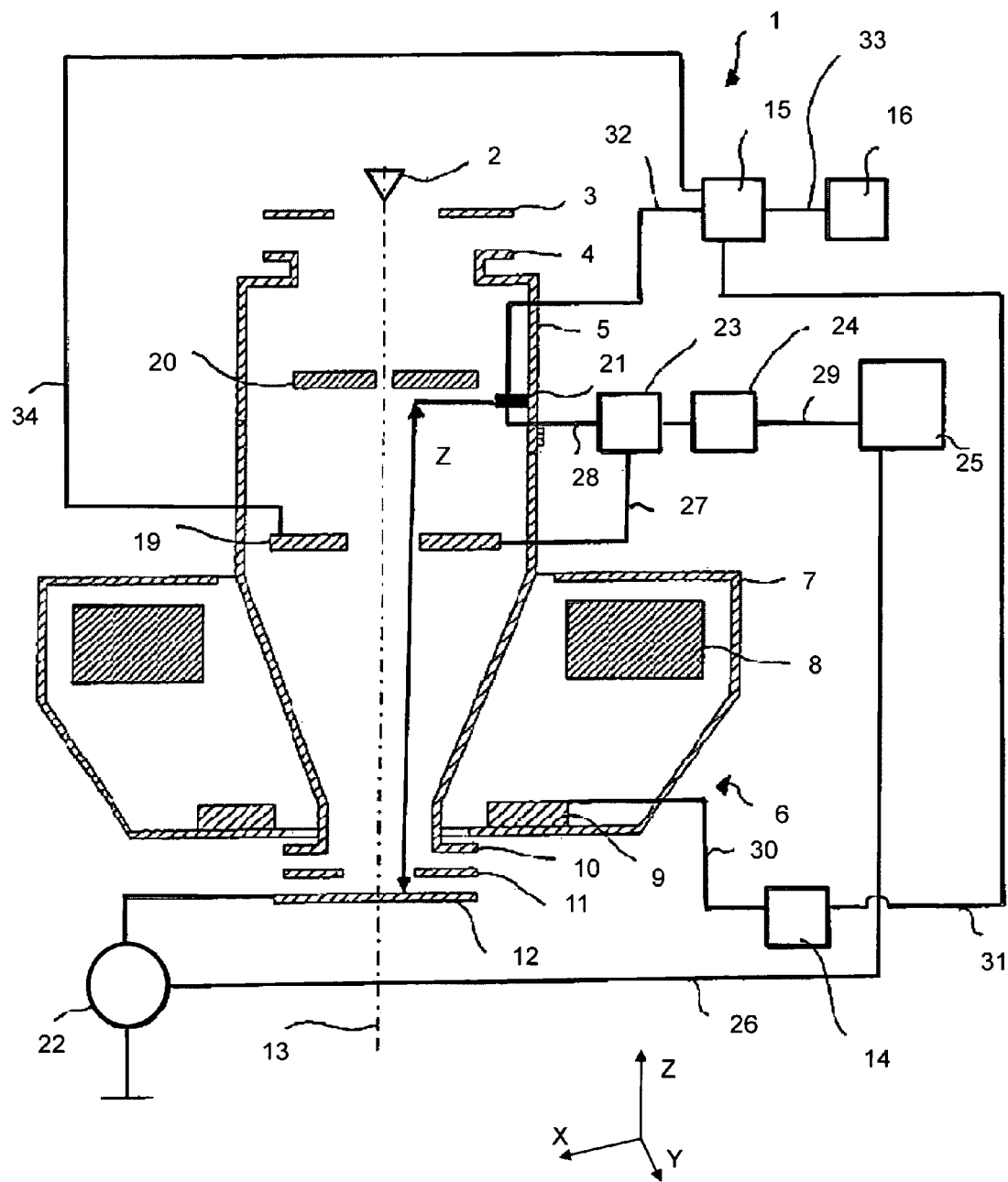

METHOD AND DEVICE FOR DISTANCE MEASUREMENT

TECHNICAL FIELD

This application relates to a method and a device for determining the distance from a sample to be examined and a reference point, in particular, in a particle beam device.

BACKGROUND OF THE INVENTION

Particle beam devices in the form of electron beam devices, in particular scanning electron microscopes, have long been known. These are used to examine surfaces of an object (sample). To do so, in the case of a scanning electron microscope, an electron beam (hereinafter referred to as the primary electron beam) is generated by particle source and focused via an objective lens on the object which is to be examined and is situated on a specimen carrier with the help of which the position of the object is adjustable. Using a deflecting device, the primary electron beam is guided in a grid pattern over the surface of the object to be examined. The electrons of the primary electron beam then interact with the object. As a result of the interaction, electrons, in particular, are emitted from the object surface (so-called secondary electrons) or electrons of the primary electron beam are scattered back (so-called backscatter electrons). The backscatter electrons have an energy in the range of 50 eV up to the energy of the electrons of the primary electron beam on the object, whereas the secondary electrons have an energy of less than 50 eV. Secondary electrons and backscatter electrons form the secondary beam, as it is referred to below, and are detected by a detector. The detector signal generated in this way is used to generate the image.

Electron beam devices have a high positional resolution, which is achieved by a very small diameter of the primary electron beam in the plane of the object. The resolution is better, the closer the object is to the objective lens of the electron beam device. It is also particularly important to focus the primary electron beam exactly on the object. It is therefore necessary to accurately determine the position of the object and thus also the distance from the object to the objective lens.

As mentioned above briefly it is also typical for many electron beam devices to use specimen carriers to hold the sample to be examined, so that the position of the sample in the electron beam device is adjustable with the help of the specimen carrier. The position is adjustable in an X-Y plane perpendicular to the beam axis of the particular electron beam device and also in the Z direction corresponding to the beam axis of the particular electron beam device. Some specimen carriers provide tilting of the sample with respect to the beam axis so that the beam axis of the electron beam device is not perpendicular to the surface of the sample. However, it is desirable in many tests of flat samples, e.g., wafers, to have the surface of the sample always perpendicular to the beam axis.

U.S. Pat. No. 4,978,856 describes an autofocus system for a scanning electron microscope having an objective lens for focusing the electron beam on an object. An excitation current supplied to the objective lens is modulated with a periodic signal. Furthermore, the excitation current is wobbled as a function of a wobble signal. The particles emitted and/or backscattered from the sample to be examined are detected. The resulting signal is integrated, thus ascertaining numerous measurement peaks having a certain value. By an approximation method, a value is determined and used to calculate the excitation current of the objective lens for focusing the electron beam on the sample. This calculated excitation current is supplied to the objective lens. In the known method and with the known device, however, it is impossible to determine the position or distance of the sample.

U.S. Pat. No. 5,216,235 describes an autofocus system for a scanning electron microscope which is provided with an optical system for determining the distance of a sample from the objective lens in addition to a particle beam column which has a particle source and an objective lens. The optical system includes a laser whose beams are directed at the sample. However, this known autofocus system is very complex due to the additional optical system. Furthermore, the sample to be examined must have good optical properties to permit an accurate determination of the distance. However, good optical properties are not ensured for all samples to be examined. Diffraction effects may also occur due to structures on the sample, leading to measuring errors.

Accordingly, it would be desirable to provide a method and a device for determining the distance between a sample and a reference point, functioning independently of the type of sample, whereby the method is easy to perform and the device also has a simple design.

SUMMARY OF THE INVENTION

In the case of the method according to the system described herein for determining the distance between a sample to be examined and at least one reference point, a first signal is modulated to a first potential of the sample. In supplying a primary particle beam to the sample, when the primary particle beam strikes the sample, a secondary particle beam made up of particles is generated and is guided away from the sample, the particles of this beam having a second potential with the modulated signal. The particles of the secondary particle beam and the signal modulated to the second potential of the particles are detected. By comparing the detected modulated signal with a reference signal, the distance between the sample and the reference point is determined using a relationship between the reference signal and the modulated signal.

Using the method according to the system described herein, it is easily possible to precisely determine the distance from the sample to a reference point, in particular a detector. Since the position of the detector with respect to an objective lens is fixed in a particle beam device, it is also possible to precisely determine the distance between the sample and the objective lens and thus also to adjust it accurately. In this way, it is easily possible to focus the primary particle beam adequately on the sample. After appropriate calibration, this method yields measurements with particularly good precision.

The particles of the secondary particle beam are in the form of charged particles. Preferably mainly electrons backscattered from the object (backscatter electrons) and detected by the detector at the reference point are used for the distance measurement. The detector is thus a detector that is sensitive to backscatter electrons.

Furthermore, the modulation at the location of the sample results in an energy difference in the backscatter electrons at the location of the detector. To this extent, the detector to be used preferably has a sensitivity that depends on the electron energy so that the second potential of the backscatter electrons which has the modulated signal is also reflected in the signal generated by the detector.

The method according to the system described herein also has the advantage in comparison with the method known from the related art that it is very simple to implement. The method according to the system described herein does not require an additional system for distance measurement. Instead the distance is determined using means that are already on hand. Thus, for example, an electron beam device has a primary particle beam, a secondary particle beam, and means for detection. These are used for performing the method according to the system described herein and for imaging. In most cases, the sample current is also measured in an electron beam device, therefore an electrical connection is provided between the sample and a measuring instrument. This electrical connection may also be used for modulation so that no other complex components need to be installed.

Furthermore, the method according to the system described herein does not make any demands with respect to optical properties of the sample to be examined in comparison with previously known optical methods for distance measurement. The present method performs distance measurement using means that are already on hand, namely, in particular, the primary particle beam and the secondary particle beam. The distance measurement via the method according to the system described herein is also very accurate because there are no measuring errors due to diffraction effects, which may occur with optical methods due to the structure of the sample to be examined. Abbé errors in particular are avoided because the method is based directly on the beam axis of the primary particle beam and the secondary particle beam.

The method according to the system described herein also ensures that unintentional tilting of a sample to be examined, situated on a specimen carrier, is detected rapidly so that appropriate countermeasures may be initiated. To do so, the sample is shifted in the X-Y direction (i.e., in a plane perpendicular to the beam axis of a particle beam device) and the distance is determined repeatedly. By comparing the measured distances, tilting of the sample is rapidly discernible. It is then possible to counteract any tilting via suitable adjustment of the specimen carrier, for example. As an alternative, the tilting may be eliminated mathematically in the analysis of the measured signals via algorithms.

The method according to the system described herein is also suitable for determining the topography of a sample. The structure of the surface of the sample is easily determined by measuring the distance.

As an alternative to modulation of a signal to the first potential of the sample, it is also possible to vary additional potentials, e.g., the high voltage potential that is used to generate the primary particle beam in an electron beam device. The potentials of components situated along the beam axis of an electron beam device may also be modulated. There must be a relationship between the location of the detector and of the modulation of a potential from which the distance is ascertained.

In a particular embodiment of the method according to the system described herein, a signal having a predetermined frequency is modulated to the first potential of the sample. A sine signal is particularly suitable. It is provided here that the frequency of the modulated signal is selectable and thus adjustable. Using the adjustable frequency, the resolution of the method may be determined, as is discussed in greater detail below. In a particular embodiment of the method according to the system described herein, a signal having a frequency between 10 MHz and 100 GHz is modulated to the first potential of the sample.

The distance between the sample and the reference point is preferably determined by a phase difference between the detected modulated signal and the reference signal. The distance is obtained using the following equation (Equation 1):

$$Z = \left(\frac{\Delta\varphi}{\pi} + \varphi_{offset}\right) \times \frac{V_{particles}}{2 \times f_{mod}} \quad \text{Equation 1}$$

where Z is the distance from the sample to the reference point, $\Delta\varphi$ is the phase difference between a first phase constant of the detected modulated signal and a second phase constant of the reference signal, $\varphi_{offset}$ is a quantity that includes essential parameters for determining distance Z, $V_{particles}$ is the velocity of the particles of the secondary particle beam and $f_{mod}$ is the frequency of the modulated signal.

Derivation and individual quantities of Equation 1 are discussed below. The transit time of the particles of the secondary particle beam from the sample to a detector situated at the reference point is given by $$t = \frac{Z}{V_{particles}}$$

where t is the transit time, Z is the distance between the sample and the detector and $V_{particles}$ is the velocity of the particles of the secondary particle beam. The phase shift between the location of the sample and the reference point, i.e., the detector, is obtained with the equation (Equation 2):

$$\Delta\varphi = 2 \times \pi \times f_{mod} \times t = \frac{2 \times \pi \times f_{mod} \times Z}{V_{particles}} \quad \text{Equation 2}$$

However, to determine the distance (absolute distance), additional effects must be taken into account, e.g., a post acceleration of the particles of the secondary particle beam upstream from the detector, possible changes in the trajectory of the particles, and possible phase offsets due to amplifiers or filters that are used in a particle beam device, in particular an electron beam device. These parameters are taken into account in a phase offset $\varphi_{offset}$. Equation 1 is obtained by rearranging Equation 2 and taking into account phase offset $\varphi_{offset}$.

As mentioned above, backscatter electrons which, after emerging from the sample, have an energy distribution having a maximum close to the excitation energy of the particles of the primary particle beam, are preferably used for determining the distance. The velocity of the backscatter electrons is calculated relativistically at high acceleration voltages of the particles of the primary particle beam.

Since no phase jumps are detected, a definite absolute measurement of the distance is possible for $\Delta\varphi \leq \pi$. This results in a maximum distance from the sample to the reference point (detector) which must not be exceeded. The maximum distance is determined by two quantities, namely the frequency of the modulated signal mentioned above (modulation frequency) and the velocity of the particles of the secondary electron beam. By rearranging Equation 2, Equation 3 is obtained with $\Delta\varphi = \pi$:

$$Z_{MAX} = \frac{V_{particles}}{2 \times f_{mod}} \quad \text{Equation 3}$$

where $Z_{MAX}$ is the maximum distance from the sample to the reference point (detector), $V_{particles}$ is the velocity of the particles of the secondary particle beam and $f_{mod}$ is the frequency of the modulated signal. As is immediately apparent, varying the velocity and the frequency of the modulated signal makes it possible to adjust the maximum distance from the sample to the reference point and thus the measuring range. If necessary, $\phi_{offset}$ may also be taken into account here.

The signal originally modulated to the first potential of the sample is preferably used as the reference signal with which the detected modulated signal is compared.

In addition, the distance may also be determined by a heterodyning method (superpositioning method) in the method according to the system described herein. In this method, a measurement is performed in chronological succession at two slightly different modulation frequencies. By determining the phase values at the two modulation frequencies, the location of the phase within an enlarged unique range may be determined uniquely, this range being determined by the frequency difference between the two modulation frequencies.

In addition to the parameters mentioned above, the resolution capability of the method according to the system described herein when determining the distance via the phase difference is also determined by the phase measurement resolution. Methods having a high phase measurement resolution are already known, so they do not need to be described further here.

The reference point of the method according to the system described herein is preferably defined by the position of a particle detector via which the particles of the secondary particle beam are detected and the modulated signal is determined. Depending on the position of the particle detector and thus depending on the distance of the particle detector from the sample, different signal-to-noise ratios may occur at different positions. To avoid the resulting measuring inaccuracies, it is advantageous to use several particle detectors set up at different positions for determining the distance. Then the distance of each particle detector from the sample is determined and suitable algorithms are used to calculate the exact distance from the sample to an objective lens.

It is also advantageous that in an exemplary embodiment of the method according to the system described herein the distance is determined automatically by measuring electronics. If the method according to the system described herein is used in a particle beam device, e.g., in a scanning electron microscope, the distance from the sample to a detector is determined automatically and immediately after insertion of a sample on a specimen carrier into a sample chamber of the particle beam device. As mentioned above, the distance from the sample to an objective lens may therefore also be determined so that the primary electron beam striking the sample may then be focused. Manual adjustment and focusing are eliminated.

As already mentioned, the method may be used in a particle beam device, in particular a scanning electron microscope. However, the method according to the system described herein is also suitable for determining the distance in a transmission electron microscope or an ion beam device.

A device according to the system described herein for determining the distance of a sample to be examined from at least one reference point, in particular for performing the method according to the system described herein, has at least one modulation unit for modulating a signal to a first potential of the sample. Furthermore, at least one particle source, for example an electron gun, is provided for generating a primary particle beam that is directed at the sample. When the primary particle beam strikes the sample, a secondary particle beam composed of particles is generated and leads away from the sample, its particles having a second potential with the modulated signal. The device also has at least one detector for detecting the particles of the secondary particle beam and the signal modulated to the second potential of the particles of the secondary particle beam and is provided with at least one analyzing unit for comparing the detected modulated signal to a reference signal. The distance is determined from the relationship between the reference signal and the detected modulated signal.

The modulation unit is preferably designed for modulating a signal having a predetermined frequency, this frequency preferably being adjustable by the modulation unit or an adjustment unit. It is advantageous here to modulate a sine signal.

In another embodiment of the device according to the system described herein, the detector is connected to the analyzer unit via a signal amplifier unit and a bandpass filter. The signal amplifier unit amplifies the signal generated by the detector, whereas the bandpass filter processes the signal generated by the signal amplifier unit.

To perform the analysis, the analyzer unit is connected to the modulation unit so that the analyzer unit receives both the signal modulated to the potential of the sample as a reference signal and the detected modulated signal. The distance from the sample to the detector is determinable by determining the phase difference between the detected modulated signal and the reference signal.

The positioning of the detector in the device may be selected suitably. In one embodiment, for example, the detector runs symmetrically about a beam axis on which the primary particle beam is guided. In this embodiment, the detector is designed as a conversion electrode, for example. When the secondary particle beam strikes this detector, secondary electrons are released and are sucked off to a suction detector, where they are detected. As an alternative to this, the detector is also designed as a combination of a scintillator and a photomultiplier.

As an alternative or in addition to the symmetrical arrangement, the detector is also situated extra-axially with respect to the beam axis on which the primary particle beam is guided.

It is also advantageous if the device according to the system described herein has multiple detectors in different positions, as already explained with regard to the method according to the system described herein.

As also already mentioned above, the method according to the system described herein is suitable in particular for use in a particle beam device, in particular in an electron beam device. The particle beam device has the device according to the system described herein. Furthermore, it is equipped with an objective lens for focusing the primary particle beam on the sample, the objective lens having a first side directed toward the particle source and a second side directed toward the sample. The detector is situated on the first side of the objective lens. The system described herein is suitable in particular for particle beam devices that are able to scan the primary particle beam over the sample via at least one scanning means. The particle beam device is preferably designed as a scanning electron microscope or as a transmission electron microscope. However, the system described herein is not limited to such particle beam devices. The system described herein is instead suitable for any particle beam device in which a distance measurement must be performed.

BRIEF DESCRIPTION OF THE DRAWING

The system described herein is explained in greater detail below in reference to the FIGURE of the drawing on the basis of an exemplary embodiment, in which:

The FIGURE shows a schematic diagram of a particle beam device having a device for determining the distance of a sample from a detector according to an embodiment of the system described herein.

DETAILED DESCRIPTION OF VARIOUS EMBODIMENTS

An example of the system described herein is provided on the basis of a scanning electron microscope. However, the system described herein is not limited to scanning electron microscopes but instead is suitable for any particle beam device.

The FIGURE shows a schematic diagram of a particle beam device in the form of a scanning electron microscope 1 according to an embodiment of the system described herein. Scanning electron microscope 1 has a particle source in the form of an electron source 2 (cathode), an extraction electrode 3 and an anode 4, which at the same time forms one end of beam guidance tube 5 of scanning electron microscope 1. Electron source 2 is preferably a thermal field emitter. Electrons emerging from electron source 2 are accelerated to anode potential because of a potential difference between electron source 2 and anode 4 and form a primary electron beam.

Scanning electron microscope 1 is equipped with an objective lens 6 having pole shoes 7 in which a bore has been cut. Beam guidance tube 5 is guided into the bore. Coils 8 such as those which have long been known are situated in pole shoes 7. An electrostatic delay device is connected downstream from beam guidance tube 5. It includes a single electrode 11 and a tubular electrode 10 formed on the end of beam guidance tube 5 opposite a sample 12. Tubular electrode 10 together with beam guidance tube 5 are thus at anode potential, while single electrode 11 and sample 12 are at a lower potential than the anode potential. In this way, electrons of the primary electron beam are decelerated to a desired low energy, which is required for analysis of sample 12. Furthermore, scanning means 9 are provided, so that the primary electron beam may be deflected and scanned over sample 12.

For detection of secondary electrons or backscatter electrons which are emitted by sample 12 and/or backscattered because of the interaction of the primary electron beam with sample 12, a detector system having detectors 19, 20 and 21 is situated in beam guidance tube 5. Detector 19 is situated symmetrically around beam axis 13 in beam guidance tube 5 slightly above objective lens 6. Detector 19 is designed in a known manner as a scintillator having a glass fiber-optic cable and a photomultiplier connected downstream.

Furthermore, a conversion electrode designed as a detector 20 is also provided at a distance from detector 19 and situated in the direction of electron source 2. When the electrons emitted by the sample and/or backscattered by the sample strike detector 20, detector 20 in turn releases secondary electrons which are drawn to detector 21 where they are detected in detector 21. Suction and acceleration of the secondary electrons from detector 20 to detector 21 are techniques that have long been known and will not be described further here.

For imaging, scanning means 9 are connected via a line 30 to a scan generator 14, which is in turn connected by a line 31 to an image generating and storage unit 15. Image generating and storage unit 15 receives detector signals that are used for imaging from detectors 21 and 19 over lines 32 and 34, respectively. Corresponding image signals are relayed over a line 33 from image generating and storage unit 15 to a monitor 16.

Sample 12 is situated on a specimen holder (not shown), for example a microscope slide, which is movable in the X direction, the Y direction, and the Z direction. In particular the specimen holder is also tiltable. Distance Z of sample 12 from detectors 19 and 21 (only distance Z of sample 12 from detector 21 is shown in the FIGURE for reasons of simplicity) is ascertained via the device described below.

Sample 12 is connected to a modulation unit 22, which is in turn connected by a line 26 to an analyzer unit 25. Analyzer unit 25 receives the signals detected by detectors 19 and 21 via a signal amplifier unit 23 and a bandpass filter 24. Lines 27, 28, and 29 are provided for connecting the individual units.

A sine signal is modulated to the potential of sample 12 by modulation unit 22. This modulated signal is actually "transmitted" to the electrons (backscatter electrons) backscattered by sample 12. For measuring the distance, mainly backscatter electrons are detected in detectors 19 and 21 and thus the modulated sine signal is also detected. However, because of the distance from sample 12 to detectors 19 and 21, the detected modulated signal is phase shifted in relation to the originally modulated signal. The phase shift is determined in analyzer unit 25. Distance Z from sample 12 to detector 21 and to detector 19 is determined by the Equation 1, as further described elsewhere herein:

$$Z = \left(\frac{\Delta\varphi}{\pi} + \varphi_{offset}\right) \times \frac{V_{particles}}{2 \times f_{mod}} \qquad \text{Equation 1}$$

where Z is the distance from sample 12 to detectors 19 and 21 and $\Delta\phi$ is the phase difference between the modulated signal at the location of sample 12 and the signal ascertained at the location of detectors 19 and 21. The other quantities have already been explained elsewhere herein.

The method and device described here make it possible in a simple way to precisely determine the distance from sample 12 to detectors 19 and 21. Since the position of detectors 19 and 21 with respect to objective lens 6 is defined in scanning electron microscope 1, the distance between sample 12 and objective lens 6 may also be determined accurately in this way and may thus also be adjusted accurately. In this way, it is easily possible to adequately focus the primary particle beam on sample 12.

The method and device described here have the advantage over the related art that no additional system is required for the distance measurement. The distance is instead ascertained using the primary electron beam and mainly the electrons backscattered by sample 12 due to a phase difference measurement. The method described here is therefore independent of the optical properties of sample 12 to be examined in particular.

It should be pointed out again explicitly that the system described herein is not limited to scanning electron microscopes. Instead, the system described herein may be used with any particle beam device, in particular with a transmission electron microscope that is operated in a spot mode (focused electron beam).

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

The invention claimed is:

1. A method for determining a distance from a sample to be examined to at least one reference point, comprising:
    modulating a signal to a first potential of the sample;
    directing a primary particle beam at the sample, a secondary particle beam composed of particles being produced when the primary particle beam strikes the sample and being directed away from the sample, and its particles having a second potential with the modulated signal;
    detecting the particles of the secondary particle beam and the signal modulated to the second potential of the particles of the secondary particle beam; and
    comparing the detected modulated signal with a reference signal, the distance being determined from a relationship between the reference signal and the detected modulated signal.

2. The method as recited in claim 1, wherein the particles of the secondary particle beam are backscatter electrons.

3. The method as recited in claim 1, wherein the signal that is modulated to the first potential of the sample has a predefined frequency.

4. The method as recited in claim 3, wherein the signal is formed as a sine signal.

5. The method as recited in claim 3, wherein the predefined frequency is selectable.

6. The method as recited in claim 1, wherein the signal is modulated with a frequency between 10 MHz and 100 GHz.

7. The method as recited in claim 1, wherein the distance of the sample from the reference point is ascertained on the basis of a phase difference between the detected modulated signal and the reference signal using the following equation:

$$Z = \left(\frac{\Delta \varphi}{\pi} + \varphi_{offset}\right) \times \frac{V_{particles}}{2 \times f_{mod}}$$

where Z is the distance from the sample to the reference point, $\Delta\phi$ is the phase difference between a first phase constant of the detected modulated signal and a second phase constant of the reference signal, $\phi_{offset}$ is a quantity that includes essential parameters for determining the distance, $V_{particles}$ is the velocity of the particles of the secondary particle beam and $f_{mod}$ is the frequency of the modulated signal.

8. The method as recited in claim 1, further comprising:
    providing a measuring range that is limited by the maximum distance allowed between the sample and the reference point, the maximum distance being defined by the following equation:

$$Z_{MAX} = \frac{V_{particles}}{2 \times f_{mod}}$$

where $Z_{MAX}$ denotes the maximum distance from the sample to the reference point, $V_{particles}$ is the velocity of the particles of the secondary particle beam and $f_{mod}$ is the frequency of the modulated signal.

9. The method as recited in claim 1, wherein the signal modulated to the first potential of the sample is used as the reference signal.

10. The method as recited in claim 1, wherein the reference point is defined as the position of a detector for detecting the particles.

11. The method as recited in claim 1, wherein the distance is determined automatically by measuring electronics.

12. The method as recited in claim 1, wherein the distance of the sample from the reference point is determined in a particle beam device.

13. The method as recited in claim 12, wherein the particle beam device is an electron microscope.

14. The method as recited in claim 1, further comprising: determining a topography of the sample to be examined.

15. A device for determining a distance of a sample to be examined from at least one reference point, comprising:
    at least one modulation unit for modulating a signal to a first potential of the sample;
    at least one particle source for generating a primary particle beam that strikes the sample, a secondary particle beam composed of particles being generated when the primary particle beam strikes the sample and being directed away from the sample, the particles having a second potential with the modulated signal;
    at least one detector for detecting the particles of the secondary particle beam and for detecting the signal modulated to the second potential of the particles of the secondary particle beam; and
    at least one analyzer unit for comparing the detected modulated signal to a reference signal, the distance of the sample to be examined from the at least one reference point being determined from a relationship between the reference signal and the detected modulated signal.

16. The device as recited in claim 15, wherein the modulation unit is designed for modulating the signal with a predefined frequency.

17. The device as recited in claim 16, wherein the signal is a sine signal.

18. The device as recited in claim 15, wherein the detector is connected to the analyzer unit via a signal amplifier and a bandpass filter.

19. The device as recited in claim 15, wherein the modulation unit is connected to the analyzer unit for providing the reference signal.

20. The device as recited in claim 15, wherein the detector runs symmetrically about a beam axis on which the primary particle beam is guided.

21. The device as recited in claim 15, wherein the detector is situated extra-axially with respect to the beam axis on which the primary particle beam is guided.

22. A particle beam device, comprising:
    at least one modulation unit for modulating a signal to a first potential of the sample;
    at least one particle source for generating a primary particle beam that strikes the sample, a secondary particle beam composed of particles being generated when the primary particle beam strikes the sample and being directed away from the sample, the particles having a second potential with the modulated signal;
    at least one detector for detecting the particles of the secondary particle beam and for detecting the signal modulated to the second potential of the particles of the secondary particle beam;
    at least one analyzer unit for comparing the detected modulated signal to a reference signal, a distance of the sample to be examined from at least one reference point being determined from a relationship between the reference signal and the detected modulated signal; and an objective lens for focusing the primary particle beam on the sample, wherein the objective lens has a first side directed toward the at least one particle source and a second side directed toward the sample and the detector is situated on the first side of the objective lens.

23. The particle beam device as recited in claim 22, wherein the detector is designed for imaging.

24. The particle beam device as recited in claim 22, further comprising:
at least one scanning means for scanning the primary particle beam over the sample.

25. The particle beam device as recited in claim 22, wherein the particle beam device is designed as a scanning electron microscope.

26. The particle beam device as recited in claim 22, wherein the particle beam device is designed as a transmission electron microscope.

27. A method for determining a topography of a sample to be examined, comprising:
using a device that determines a distance of the sample to be examined from at least one reference point to determine the topography of the sample, the device including:
at least one modulation unit for modulating a signal to a first potential of the sample;
at least one particle source for generating a primary particle beam that strikes the sample, a secondary particle beam composed of particles being generated when the primary particle beam strikes the sample and being directed away from the sample, the particles having a second potential with the modulated signal;
at least one detector for detecting the particles of the secondary particle beam and for detecting the signal modulated to the second potential of the particles of the secondary particle beam; and
at least one analyzer unit for comparing the detected modulated signal to a reference signal, the distance of the sample to be examined from the at least one reference point being determined from a relationship between the reference signal and the detected modulated signal.

28. The method as recited in claim 27, wherein the device further includes:
an objective lens for focusing the primary particle beam on the sample, wherein the objective lens has a first side directed toward the at least one particle source and a second side directed toward the sample and the detector is situated on the first side of the objective lens.

\* \* \* \* \*